United States Patent
Chen et al.

(10) Patent No.: US 6,937,688 B2
(45) Date of Patent: Aug. 30, 2005

(54) STATE MACHINE, COUNTER AND RELATED METHOD FOR GATING REDUNDANT TRIGGERING CLOCKS ACCORDING TO INITIAL STATE

(75) Inventors: Yung-Huei Chen, Taipei Hsien (TW); Shan-Ting Hong, Taipei Hsien (TW)

(73) Assignee: VIA Technologies Inc., Hsin-Tien (TW)

( * ) Notice: Subject to any disclaimer, the term of this patent is extended or adjusted under 35 U.S.C. 154(b) by 241 days.

(21) Appl. No.: 10/065,967

(22) Filed: Dec. 5, 2002

(65) Prior Publication Data

US 2004/0022347 A1 Feb. 5, 2004

(30) Foreign Application Priority Data

Aug. 1, 2002 (TW) ........................................ 91173385 A

(51) Int. Cl.[7] .............................................. H03K 21/16
(52) U.S. Cl. ........................... 377/116; 377/28; 377/33; 377/34; 377/40; 377/104; 327/291; 327/295
(58) Field of Search .................................. 377/116, 104, 377/28, 33, 40, 34; 327/291, 295

(56) References Cited

U.S. PATENT DOCUMENTS

| | | | | |
|---|---|---|---|---|
| 5,481,581 A | * | 1/1996 | Jonas, Jr. ...................... | 377/55 |
| 5,960,052 A | * | 9/1999 | Bombal et al. ................ | 377/29 |
| 6,026,140 A | * | 2/2000 | Owen .......................... | 377/51 |

* cited by examiner

Primary Examiner—Margaret R. Wambach
(74) Attorney, Agent, or Firm—Winston Hsu

(57) ABSTRACT

A state machine, a counter, and related method for gating redundant triggering clocks according to the initial states is provided. The state machine includes a plurality of state units and a clock gating circuit. Each of the state unit is triggered by a clock to generate a corresponding varying state, and the clock gating circuit is capable of selectively withholding a triggering clock to at least one state unit according only to an initial state, such that the selected state unit(s) will not be triggered by the triggering clock while the rest of the state units are triggered by the triggering clock to update their corresponding states.

10 Claims, 8 Drawing Sheets

|    | B4 | B3 | B2 | B1 |
|----|----|----|----|----|
| T1 | 1 | 1 | 1 | 1 |
| T2 | 1 | 1 | 1 | 0 |
| T3 | 1 | 1 | 0 | 1 |
| T4 | 1 | 1 | 0 | 0 |
| T5 | 1 | 0 | 1 | 1 |
| T6 | 1 | 0 | 1 | 0 |
| T7 | 1 | 0 | 0 | 1 |
| T8 | 1 | 0 | 0 | 0 |
| T9 | 0 | 1 | 1 | 1 |
| T10 | 0 | 1 | 1 | 0 |
| T11 | 0 | 1 | 0 | 1 |
| T12 | 0 | 1 | 0 | 0 |
| T13 | 0 | 0 | 1 | 1 |
| T14 | 0 | 0 | 1 | 0 |
| T15 | 0 | 0 | 0 | 1 |
| T16 | 0 | 0 | 0 | 0 |

Fig. 3 Prior art

|  | B4 | B3 | B2 | B1 |
|---|---|---|---|---|
| T1 | 0 | 1 | 1 | 1 |
| T2 | 0 | 1 | 1 | 0 |
| T3 | 0 | 1 | 0 | 1 |
| T4 | 0 | 1 | 0 | 0 |
| T5 | 0 | 0 | 1 | 1 |
| T6 | 0 | 0 | 1 | 0 |
| T7 | 0 | 0 | 0 | 1 |
| T8 | 0 | 0 | 0 | 0 |

Fig. 4 Prior art

STATE MACHINE, COUNTER AND RELATED METHOD FOR GATING REDUNDANT TRIGGERING CLOCKS ACCORDING TO INITIAL STATE

BACKGROUND OF INVENTION

1. Field of the Invention

The present invention relates to digital electronics, and more specifically, to a digital counter circuit.

2. Description of the Prior Art

All kinds of microprocessor systems have become an important foundation for modern information devices. A basic application specific integrated circuit (ASIC) can be viewed as a basic microprocessor system. Electronic devices with complete architecture, such as cellular phones, personal digital assistants, or personal computers, assemble lots of microprocessor systems to implement various digital processing functions. In microprocessor systems, the method of pulse triggering sequential control is often used to negotiate the systems in different structure blocks at different times for specific functions, thus the overall function for this microprocessor can be achieved. For instance, if one microprocessor system is required to implement a particular task, A circuit must process the information and then pass it on to B circuit, and then B circuit will carry on and continue to process data. Now microprocessor systems can use sequential control, first to trigger circuit A for data processing, and sequentially trigger circuit A to transfer finished data to circuit B, and then trigger circuit B to receive data, and begin data processing.

With sequential control triggering, the order of all structure blocks of microprocessor systems can be organized to implement the functionality of microprocessor systems.

When a microprocessor system is required to use sequential control, a state machine will base a trigger on a pulse to create the varying states according to predetermined order, and these states will trigger other structure blocks in the microprocessor system to perform various functions. Please refer to FIG. 1. FIG. 1 is a functional block diagram of a prior art state machine 10. State machine 10 has a plurality of state units 12 (FIG. 1 shows three units as representatives), and all state units 12 set a sequential logic circuit 14 and a combinational logic circuit 16. In general, every state unit 12 can produce a one bit state bit 18 as a corresponding output state. By combining state bits 18 generated by all state units 12 in the state machine 10, a multi-bit state 20 of digital data is then formed. In order to coordinate a unified operation for all state units 12, the state machine 10 uses a pulse CLK0 as the triggering clock to trigger the operation of all state units. Pulse CLK0 has a plurality of cyclic pulses, every pulse triggering the state machine 10 to update its state 20.

In all state units 12, the sequential logic circuit 14 is usually a flip-flop having an input port D0 to receive an input signal, an output port Q0 to transmit an output state bit, a setting port S0, and a pulse end T0. The sequential logic circuit 14 can receive the pulse CLK0 trigger from pulse end T0 in every cycle of pulse CLK0. The input signal comes in from input port D0, and the state bit 18 after update will then be sent out from output port Q0. The operational feature of the sequential logic circuit 14 is that in certain cycles of pulse CLK0, the updated state bit 18 will be outputted. This state bit is not only related to the input data received by the input port D0, but is also related to the state bit 18 (namely the state bit 18 before update) of a previous cycle from output port Q0. In other words, the sequential logic circuit 14 can "memorize" a previous output state bit. In addition, setting port S0 of the sequential logic circuit 14 is used to receive an initial state 22. The sequential logic circuit 14 then uses this initial state to set a state bit from the output port Q0 to a specific initial value. When the sequential logic circuit 14 receives triggers from following the cyclic pulse CLK0, the state bit 18 that is sent out from the output port Q0 starts to update sequentially from this specific initial value. The combinational logic circuit 16 of all state units 12 are usually formed by all sorts of logic gates, which use state 20 to produce input data corresponds to sequential logic circuit 14.

The operational principle of the state machine 10 is described below. When the state machine 10 starts to operate, it will first transfer initial states to every state unit 12, set output state 20 of every state unit 12 to a specific initial value. Then, triggered by every cycle of pulse CLK0, each state unit 12 will update its own state bit 18, and thus so will the state 20. In certain cycles of pulse CLK0, the corresponding state 20 will go through the combinational logic 16 of each state unit 12 and generate the input for every sequential logic circuit 14. And in the next cycle, all state units 12 can use the input data from combinational logic circuit (i.e. state 20 of the previous cycle), plus the "memory" function of all sequential logic circuits to update state 20. Circuit designers only have to design combinational logic circuits in state unit 12, and the state machine 10 will be triggered by pulse CLK0, and update the contents of state 20 according to the specific sequence.

Among all microprocessor systems, a counter is a special kind of microprocessor system. Please refer to FIG. 2. FIG. 2 is a functional block diagram of a prior art counting down binary counter 30. In the example of FIG. 2, the counter 30 has a plurality of state units (four shown in FIG. 2 as representatives) 31 and one accessory circuit 35. These four state units 31 are used to generate bits B1 to B4 to become the state 36 of counter 30 (i.e. the counting value of counter 30). In other words, bits B1 to B4 are the state bits of every state unit 31 of counter 30. After receiving an initial value enable signal EN1, accessory circuit 35 uses an initial state 34 to set the corresponding initial values of state bits in every state unit 31. After receiving a counter enable signal EN2, a triggering clock pulse CLK is transferred to every state unit 31. In all state units 31, a flip-flop 32 can be used as a sequential logic circuit. The state units 31 use AND gates 37 to assemble the various combinational logic circuits. The flip-flops 32 can be T type flip-flops with an input end T as an input port, and two output ends Q and Q" for transferring two inverse bits are the output port. A setting end S is the setting port, which is used to receive an initial state setting from accessory circuit 35 to set the corresponding initial value of state bit in every initial state of sequential logic circuit. The pulse end CK is used to receive the triggering pulse CLK.

When a microprocessor system uses prior art counter 30 to perform counting, it first loads enable signal EN1 with initial values to trigger accessory circuit 35, and uses initial values 34 to set initial values of every corresponding state bit in every state unit 31. When counting begins, the counting enable signal EN2 triggers accessory circuit 35 to transfer pulse CLK to every state unit 31, and counter 30 uses the triggering of pulse CLK to start counting.

Please refer to FIG. 3 and FIG. 2. In the counter 30, based on the design of various combinational logic circuits of the state units 31, the sequential changes follow the triggering of pulse CLK for state 36 as is shown in FIG. 3. The vertical axis of FIG. 3 is time, and waveform 38 represents changes of pulse CLK through time (a horizontal axis of waveform 38 is a magnitude of the waveform). As shown in FIG. 3, pulse CLK has a plurality of cyclic pulses, and the duration of every cycle is T. Follow the triggering of pulse CLK in cycle T1, T2 and T3, the combination of state 36 from bit B1 to B4 changes sequentially from "1111", "1110", "1101" and so on, as shown in FIG. 3. In other words, if we consider state 36 as the counting value of counter 30, state 36 in FIG. 3 counts down from "1111" to "0000".

Counters are used extensively in microprocessors and computer systems. For instance, please refer to the counter 30 in FIG. 2 and FIG. 3. If a first structure block in a microprocessor has to issue a special command to a second structure block at a certain interval (say 16 pulse cycles), the first structure block can set timer 30 to start counting down from a certain initial value (such as "1111" in FIG. 3). After a certain count (for instance "0000" in FIG. 3), the first structure block will know how many pulse cycles of time has passed and issue this special command. On the other hand, if the first structure block in the microprocessor is required to transfer certain data (say 16 items) to another second structure block, after the counter 30 counts down from "1111" to "0000", the first structure block will know that the 16 data entries have been transferred.

In order to have more functional flexibility in microprocessors, every structure block can set different initial values for the counter. To further elaborate on the previous example, if the first structure block originally issues a special command every 16 pulse cycles, but because of operational needs it has to be modified to issue a special command every eight pulse cycles, the first structure block can set the initial state of counter 30 to "0111" and start counting down from "0111". Similarly, when the counter 30 reaches "0000", first structure block will know that eight cycles have passed, as shown in FIG. 4. FIG. 4 is a state change table of state 36 of counter 30 starting from "0111" and counting down to "0000". The vertical axis in FIG. 4 is time. If after transferring 16 data entries, the first structure block has four more data entries to transfer, the first structure block can set the initial state of counter to "0011" and transfer according to a count down of "0011", "0010", "0001" and "0000". When it reaches "0000", the first structure block will know that four data entries have been transferred. Common state machines can perform similar functions.

When operating counters with the above method, some state units stay in the same state without any changes. For instance, referring to the example in FIG. 4, when the counter 30 is used to count eight (eight cycle pulses), state output for the state unit that generates bit B4 is never changed, that is, bit B4 is always "0". Similarly, if counter 30 is used only to count four, only the state units corresponding to bits B2 and B1 will operate and be updated; the state units corresponding to bits B3 and B4 will not be updated. Furthermore, if more flexibility of a counter is needed, more counting units can be added to the counter so that the states of the counter (the counting value) will have more state bits. For instance, for one eight bit counter, there are 256 pulse cycles required to go through in the process of counting down from "11111111" to "00000000". By controlling the initial states, it can count any number between 1 and 256. Similarly, when counting numbers less than 256, there will be state units in the eight bit counter not changing states. The less the number, the more state units without changing states. If an eight bit counter is used to count the number "8", there will be five state units without changing states. When counting the number "4", six state units will not change their states. This situation happens when using state machines flexibly, that is, when state output of some state units remains the same.

However, as shown in FIG. 1 and FIG. 2, because every state unit in the state machine or counter has to coordinate operation in synchronization, prior art state units are unified by a single pulse trigger; even though some state units do not change states, the pulse still drives these state units. In general, modern technology implements state units and sequential logic by complementary metal oxide semiconductor (CMOS). Please refer to FIG. 5. FIG. 5 is a typical logic gate 40 implementation of a CMOS circuit. A logic gate 40 uses a bias source Vd and grounding G as a DC bias. N-type CMOS gates M1, M2 are electrically connected to nodes N1, N2 respectively, and P-type CMOS gates M3, M4 are electrically connected to nodes N1, N2 respectively, and receive input from bit A and bit B respectively. Output bit C is taken from node N3 to complete an implementation of a NAND gate. When input bit A is an alternating pulse of "0", "1", and bit B is fixed at "0", the output bit C will not change along with bit A but will be "1". Under this circumstance, although the output bit C of the logic gate 40 never changes, and bit A is still being driven between "1" and "0" (between a high and a low voltage level), power consumption still exists. As CMOS gates can be viewed as capacitors, when bit A goes from "0" to "1", power is required to charge gates of transistors M1 and M3. When bit A goes from "1" to "0", power is also required to discharge gates of transistors M1 and M3. In other words, even though the state of a state unit is not changing according to the pulse trigger, the state unit, being formed by logic gates, still consumes driving power.

Consider the flexible or variable usage of the prior art counter or state machine as discussed above. Only a subset of state units is used, other redundant state units do not change the output state. But when pulses drive the state units of the counter or state machine, the state units that do not change state still consume driving energy of the pulses. For instance, when counter 30 in FIG. 2 is used to count the number "8" according to the method of FIG. 4, even though bit B4 never changes, the corresponding state unit still consumes driving power. So, not only is the power consumption of the microprocessor system wasted, it also becomes more difficult to promote circuit integration in microprocessor system chips.

SUMMARY OF THE INVENTION

It is therefore a primary objective of the claimed invention to provide a counter and related application and method that can use an initial state to judge which state units will not change state, and to stop providing pulses to these state units. This is to rectify the above-mentioned problem of the prior art.

Briefly summarized, the state machine or counter of the claimed invention comprises a clock gating circuit. During the process of following states changing, the clock gating circuit can use an initial state to judge which state units will remain unchanged and cease pulse transfer to these state units. Thus, power is not needed for pulses to drive these unchanging state units. Hence, the claimed invention minimizes the burden and power consumption of system driving pulses.

These and other objectives of the claimed invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 and FIG. 4 are sequence diagrams of state variations for the counter of FIG. 2.

DETAILED DESCRIPTION

Figure 1:
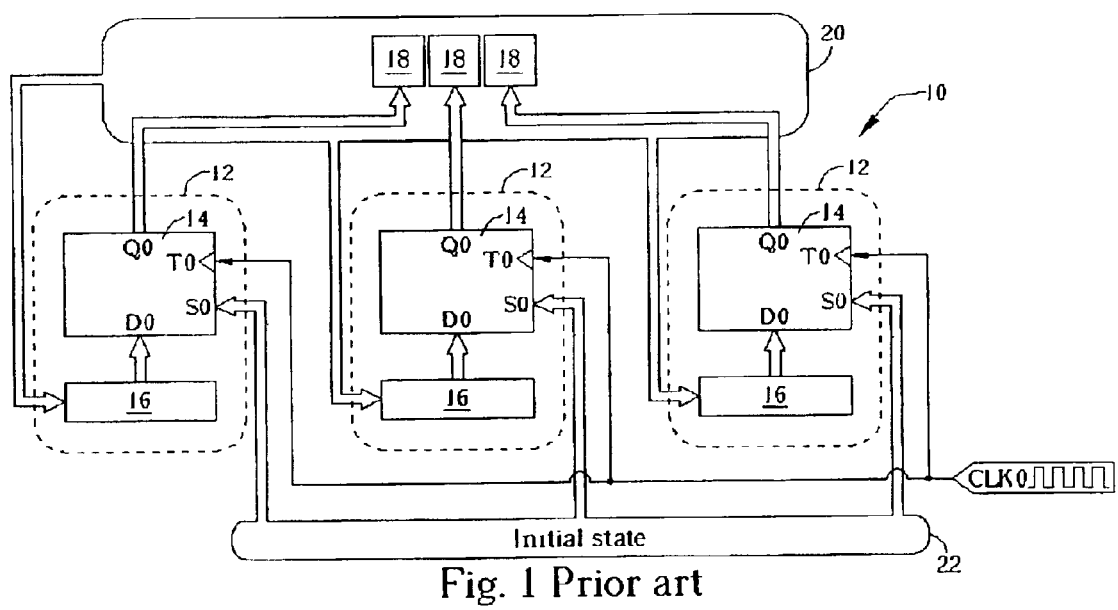
FIG. 1 is a functional block diagram of a prior art state machine.
Figure 6:
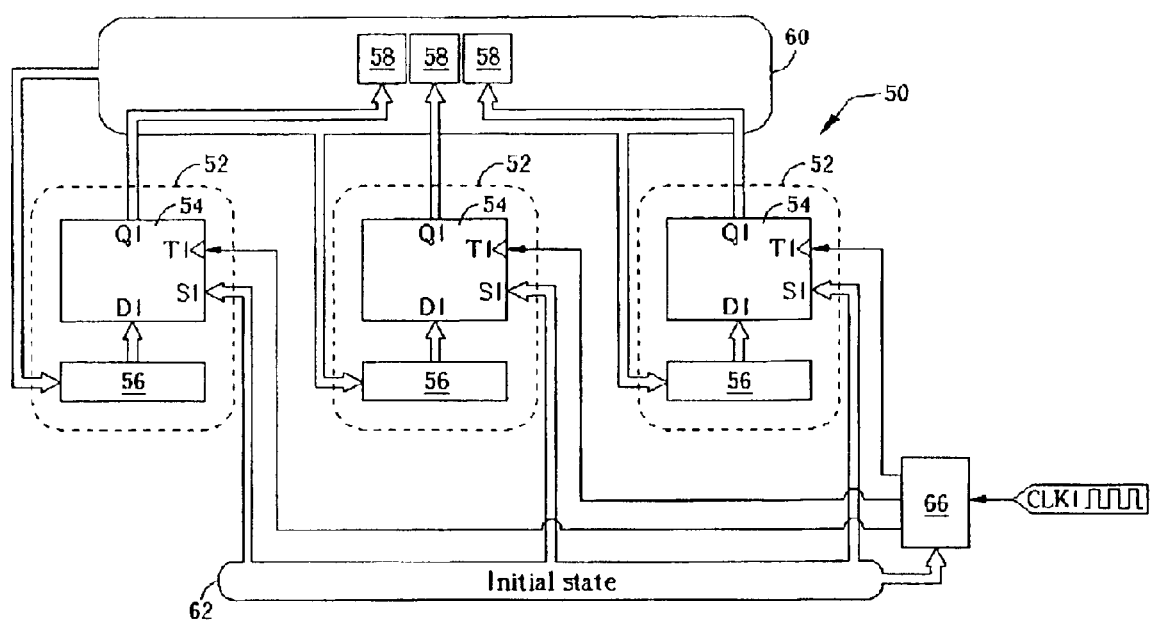
FIG. 6 is a functional block diagram of a state machine according to the present invention.

Please refer to FIG. 6. FIG. 6 is a functional block diagram of a state machine 50 according to the present invention. Similar to the prior art state machine 10 in FIG. 1, the state machine 50 has a plurality of state units 52 (three are shown in FIG. 6 as representative). The state machine 50 uses triggering of pulses to generate varying state bits 58 as state output. The state bits 58 are generated by state units 52 and become a state 60 produced by the state machine 50. Every state unit 52 has a sequential logic circuit 54 and a combinational logic circuit 56. Every sequential logic circuit 54 has an input port D1, an output port Q1, a setting port S1, and a pulse end T1. Based on input data of the input port D1 and a pulse trigger from the pulse end T1, the sequential logic circuit 54 can output state bit 58 from the output port Q1. Based on an initial state 62 transferred from the setting port S1, the sequential logic circuit 54 can set an initial value of the state bit 58.

A major difference between the present invention and the prior art state machine is a clock gating circuit 66 of the present invention, which is used to judge which state units 52 have unchanged output in regard to the state 60 during the varying processes based on the initial state 62. After determining the state units that are not changing, the clock gating circuit 66 stops providing pulses to these state units to reduce pulse power consumption. Of course, for state units with varying state output, the clock gating circuit 66 still provides a single clock CLK1 as a triggering pulse to trigger state unit output to vary with time.

Figure 7:
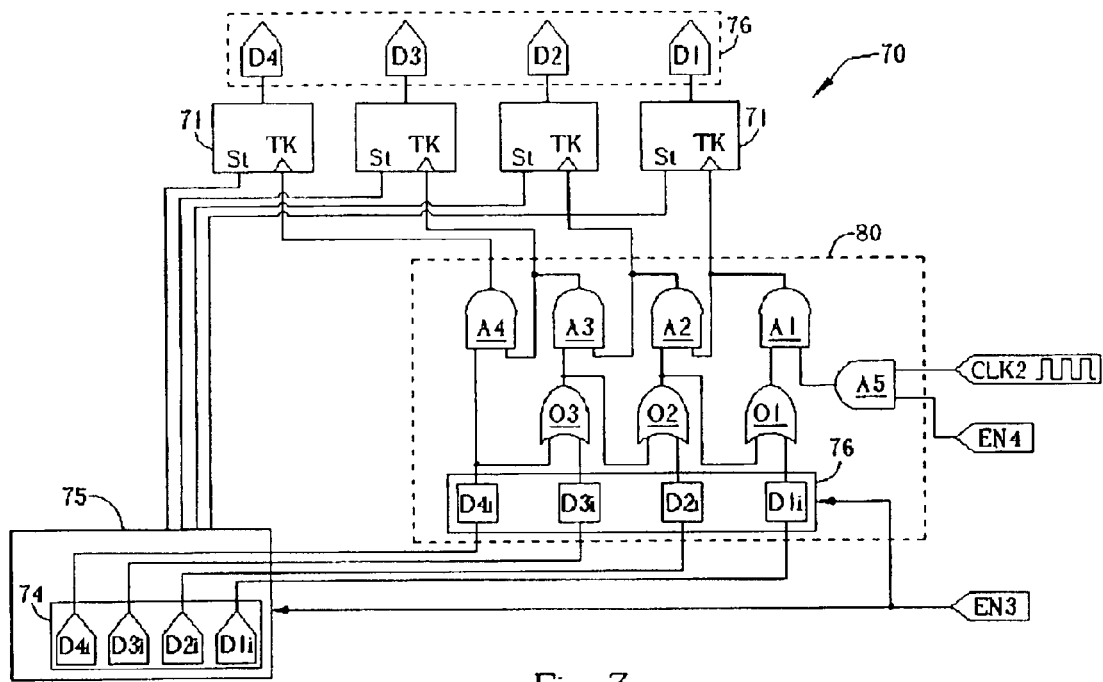
FIG. 7 is a functional block diagram of a counter according to the present invention.

Please refer to FIG. 7. To better explain the present invention according to the preferred embodiment, consider a four bit binary counter 70 as shown in FIG. 7. Similar to the counter of FIG. 2, the counter 70 has four state units 71, and every state unit 71 generates a corresponding bit from D1 to D4 as its output bit. Combining bits D1 to D4 forms a state 76 of counter 70 (that is, the counter value of counter 70, where bit D4 is the most significant bit, MSB). The basic structure of every state unit 71 (such as sequential logic circuit and combinational logic circuit) is as the state unit 31 of FIG. 2 and is not repeated here. In order to highlight the focus of the present invention, every state unit 31 in FIG. 7 only has one corresponding setting end St and one pulse end TK. Each state unit 71 uses data entered from the setting end St to set an initial value of a corresponding initial state, and is then triggered by the input pulse end TK to let the corresponding state output vary with time. Additionally, the counter 70 also has an accessory circuit 75 to receive an initial value loading enable signal EN3, and use an initial state 74 to set the initial value of state output for each state unit. Corresponding to the state 76 that is formed by bits D1 to D4, the initial state 74 is formed by four bits D1$i$ to D4$i$. The bits D1$i$ to D4$i$ are the initial values for the bits D1 to D4.

Figure 2:
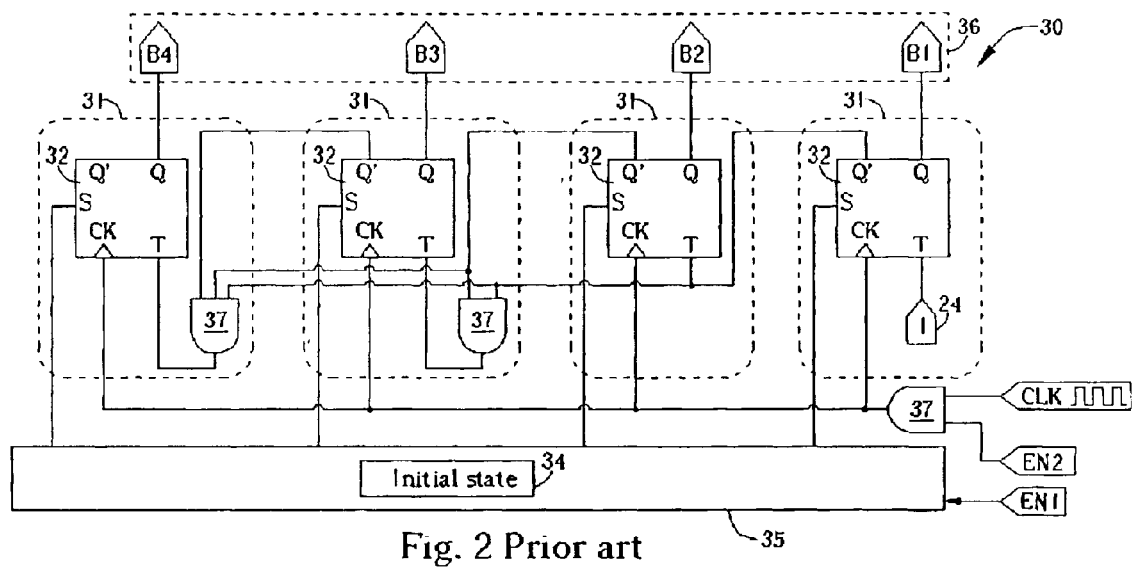
FIG. 2 is a functional block diagram of a prior art counter.
Figure 5:
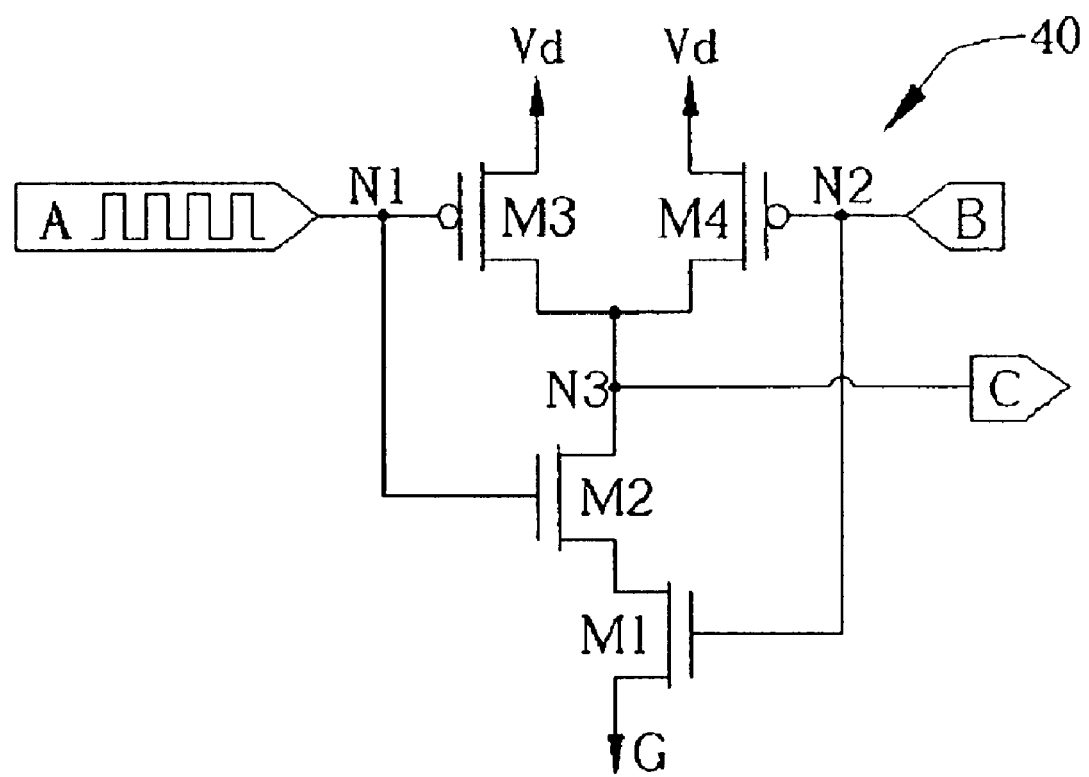
FIG. 5 is a circuit diagram of a typical CMOS logic gate.

A most important difference between the counter 70 of the present invention and the prior art counter 30 of FIG. 2 is a clock gating circuit 80 applied in the present invention counter 70. The clock gating circuit 80 can selectively provide pulse clock CLK2 to specific state units 71. In the preferred embodiment, the clock gating circuit 80 comprises AND gates A1 to A4, OR gates O1 to O3 and a latch circuit 76. The AND gates A1 to A4 are electrically connected to the pulse ends TK of the four state units that generate bits D1 to D4. In other words, output of the AND gates A1 to A4 are the triggering pulses of every state unit 71. The AND gate AS is used to transfer triggering clock CLK2 into the clock gating circuit 80 based on a counting enable signal EN4. When the accessory circuit 75 is triggered by the initial value loading enable signal EN3 to set the initial values for every state unit 71, the enable signal EN3 also triggers latch circuit 76 to store the initial state of each bit D1$i$ to D4$i$. Every OR gate and AND gate in clock gating circuit 80 can use bits D1$i$ to D4$i$ in latch circuit 76 to selectively provide pulse clock CLK2 to some of the state units 71. For instance, when the counter 70 is used to count the number "8", the initial state 74 will be "0111" (as shown in FIG. 4); bits D4$i$ to D1$i$ are digital numbers "0", "1", "1", and "1" respectively. As a result, the output for OR gates O1 to O3 is "1", "1", "1". When the counting enable signal EN4 changes from "0" to "1" and triggers counter 70 to start counting, the pulse clock CLK2 is transferred from AND gate AS to AND gate A1 to provide pulse clock CLK2 to the corresponding state unit of bits D1, D2 and D3 from AND gates A1, A2 and A3 respectively. As for the state unit corresponding to bit D4, its state stays the same during the count down process. Because one input end of the AND gate A4 is a digital "0" received from bit D4$i$, AND gate A4 does not transfer the pulse clock CLK2 to the corresponding state unit of bit D4. Thus the D4 state unit will not be triggered by the pulse clock CLK2, and bit D4 can remain in its initial value (the value of bit D4$i$). Power of pulse CLK2 will not be consumed by driving the corresponding state unit of bit D4. Finally, the counter 70 can still function normally and based on the state variation of FIG. 4 can count down from an initial state of "0111" to "0000".

Similarly, if the counter 70 is required to count down from "0011" to "0000" to count the number "4", the operational result of OR gates O3 to O1 in clock gating circuit 80 will be "0", "1", and "1" respectively. Pulse clock CLK2 will only be output from AND gates A2 and A1 to the corresponding state units of bits D2 and D1. The output of the AND gate A3 is a digital "0", and since both input ends of the AND gate A4 are "0" its output is likewise "0". Thus, the pulse clock CLK2 does not trigger the two state units corresponding to bits D3, D4. The counter 70 can therefore count down from an initial state of "0011" to "0010", "0001", and finally to "0000" according to the pulse trigger.

Figure 8:
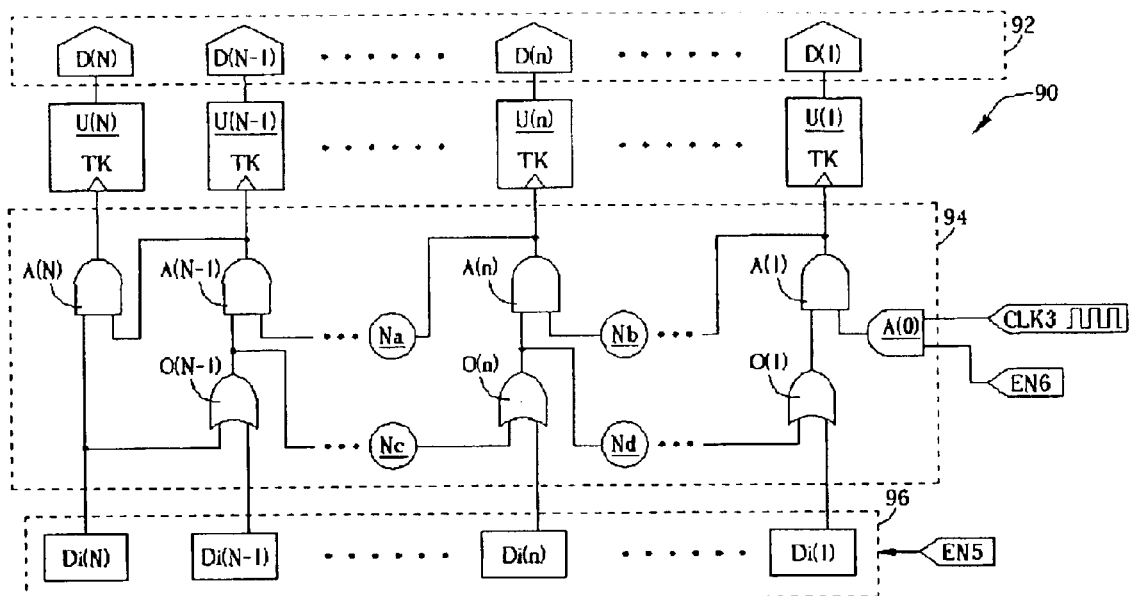
FIG. 8 is a functional block diagram of a clock gating circuit according to the present invention.

Please refer to FIG. 8. FIG. 8 is a functional block diagram of a clock gating circuit 94 according to the present invention in an N digit binary counter 90. The counter 90 has a plurality of state units U(N), U(N−1) to U (n), U(1) that generate corresponding state output bits D(N), D(N−1) to D(n), D(1), which form a state 92 of the counter 90. In order to highlight basic design principles of the clock gating circuit 94, under normal circumstances, all state units only rely on corresponding pulse ends TK used for receiving pulse triggers; the accessory circuits used to set initial values for every state unit are omitted for clarity. The clock gating circuit 94 has AND gates A(N), A(N−1) to A(n), A(1), A(0) and OR gates O(N−1), O(n) to O(1). A latch circuit 96 is used to adapt the trigger of an initial value loading enable signal ENS and to store initial values of each bit corresponding to each state unit, that is, bits Di(N), Di(N−1) to Di(n), Di(1). The AND gate A(0) transfers pulse clock CLK3 to clock gating circuit 94 in accordance with a counting enable signal EN6. The AND gates A(N) to A(1) correspond to state units U(N) to U(1) respectively. As shown in FIG. 8 the pulse end TK of state unit U(n) is triggered by output of AND gate A(n). An output end of the AND gate A(n) is electrically connected to one input end of the AND gate A(n+1) at a node Na. One input end of the AND gate A(n) is connected to an output end of the OR gate O(n), and another input end is electrically connected to an output end of AND gate A(n−1) at node Nb. An output end of the OR gate O(n) is electrically connected to one input end of the OR gate O(n−1) at a node Nd. An input end of the OR gate O(n) is used to receive the bit Di(n) (i.e. an initial value of bit D(n)), and another input end of the OR gate O(n) is electrically connected to an output end of the OR gate O(n+1) at a node Nc. When this N bit counter 90 is used to count number $2^L$ (2 to the power of L), Di(1) to Di(L) are "1" and Di(L+1) to Di(N) are "0" (i.e. the most significant bit of state 92 is D(n)). So, OR operation output of OR gates O(1) to O(L) are all "1", and the OR gates O (L+1) to O(N−1) output "0". One input end of the AND gates A(1) to A(L) is "1", so pulse CLK3 is transferred to state units U(1) to U(L) to trigger these state units to update bits D(1) to D(L). One input end of AND gate A(L+1) receives the output pulse of the AND gate A(L), but the other input end is "0" so it do not transfer pulses to state unit U(L+1). Both ends of the AND gates A(L+2) to A(N) are "0", so they do not trigger state units U(L+2) to U(N). The counter 90 does not have to trigger those state units in which the state does not change, namely U(L+1) to U(N). The state units U(L) to U(1) can count down from $2^L$ and correspondingly vary to state 92. Of course, FIG. 7 and FIG. 8 only demonstrate preferred embodiments of the present invention clock gating circuit; other circuits with similar structures can also apply the present invention clock gating circuit. A most important point is to judge whether the state of state units will change basedonan initial state, and correctly provide pulses to the state units with changing state output and withhold pulses from the state units without changing state output.

In conclusion, when prior art counters or state machines are in use, even though states of some state units rarely change, systems still trigger these state units. Additional power is wasted in the form of pulses to drive these state units causing unnecessary waste of system resources. In comparison, the present invention uses a clock gating circuit to determine state units without changing states based on initial states, and withholds pulses from these state units. Only those state units with changing states receive pulses. In this way, the present invention can minimize the power requirement for pulse driving circuitry, avoiding unnecessary waste of system power and resources, thereby boosting the efficiency of resource utilization for microprocessor systems.

Described above is only the preferred embodiment of the present invention. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A counter comprising:

a plurality of state units for generating a state, each state unit having a corresponding clock end for receiving a clock having a plurality of pulses; wherein each said state unit is capable of updating its corresponding state when receiving different pulses from the clock according to a predetermined law while each said state unit receives the clock from its corresponding clock end; and a clock gating circuit electrically connected to the plurality of state units for selecting at least one first state unit and at least one second state unit from the plurality of state units according only to an initial value and providing a triggering clock to the clock end of each said at least one first state unit and withholding the triggering clock from the clock end of each said at least one second state unit, such that second states corresponding to each said at least one second state unit are held constant while each said at least one first state unit updates its state corresponding to said at least one first state unit according to different pulses of the triggering clock; wherein the clock gating circuit does not provide the triggering clock to each said at least one second state unit according to each state changed of the said at least one first state unit, and does not withhold the triggering clock from each said at least one first state unit; and a latch circuit connected to the clock gating circuit for storing the initial value.

2. The counter of claim 1 wherein the clock gating circuit selects corresponding different said at least one first state unit and said at least one second state unit from the plurality of state units while the initial value changes.

3. The counter of claim 1 wherein each said state unit further comprises a setting end for receiving an initial state so that each said state unit outputs the initial state while each said state unit is first triggered by a clock pulse received from the corresponding clock end, then updates its corresponding state output when receiving following pulse of the clock according to the predetermined law.

4. The counter of claim 3 wherein the counter is capable of setting the initial state of each said state unit from the setting end of each said state unit according to the initial value while the clock gating circuit selects said at least one first state unit and said at least one second state unit according to the initial value.

5. The counter of claim 1 wherein each said state unit further comprises a flip-flop.

6. A method for a counter, the counter comprising:

a plurality of state units for generating a state, each state unit having a corresponding clock end for receiving a clock having a plurality of pulses; wherein each said state unit is capable of updating its corresponding state when receiving different pulses from the clock according to a predetermined law while each said state unit receives the clock from its corresponding clock end; and a latch circuit connected to a clock gating circuit for storing an initial value;

the method comprising:

selecting at least one first state unit and at least one second state unit from the plurality of state units according only to the initial value and providing a triggering clock to the clock end of each said at least one first state unit and withholding the triggering clock from the clock end of each said at least one second state unit, such that second states corresponding to each said at least one second state unit are held constant while each said at least one first state unit updates its state corresponding to said at least one first state unit according to different pulses of the triggering clock.

7. The method of claim 6 further comprising selecting different said at least on first state unit and said at least one second state unit from the plurality of state units while the initial value changes.

8. The method of claim 6 wherein each said state unit further comprises a setting end for receiving an initial state so that each said state unit outputs the initial state while each said state unit is first triggered by a clock pulse received from the corresponding clock end, then updates its corresponding state output when receiving a following pulse of the clock according to the predetermined law.

9. The method of claim 8 further comprising setting the initial state of each said state unit from the setting end of each said state unit according to the initial value while selecting said at least one first state unit and said at least one second state unit according to the initial value.

10. The method of claim 6 wherein each said state unit further comprises a flip-flop.

* * * * *

UNITED STATES PATENT AND TRADEMARK OFFICE
CERTIFICATE OF CORRECTION

PATENT NO. : 6,937,688 B2 Page 1 of 1
APPLICATION NO. : 10/065967
DATED : August 30, 2005
INVENTOR(S) : Chen et al.

It is certified that error appears in the above-identified patent and that said Letters Patent is hereby corrected as shown below:

Title page, item (30) Foreign Application Priority Data: Delete "91173385" and insert --91117385--.

Signed and Sealed this

Twenty-ninth Day of May, 2007

JON W. DUDAS
*Director of the United States Patent and Trademark Office*